(12) United States Patent
Reznik et al.

(10) Patent No.: US 6,950,314 B2
(45) Date of Patent: Sep. 27, 2005

(54) ARRANGEMENT FOR THE ELECTRICAL CONNECTION OF AN OPTOELECTRONIC COMPONENT TO AN ELECTRICAL COMPONENT

(75) Inventors: Daniel Reznik, Berlin (DE); Volker Plickert, Brieselang (DE); Lutz Melchior, Berlin (DE)

(73) Assignee: Infineon Technologies AG, Munich (DE)

( * ) Notice: Subject to any disclaimer, the term of this patent is extended or adjusted under 35 U.S.C. 154(b) by 49 days.

(21) Appl. No.: 10/789,429

(22) Filed: Feb. 27, 2004

(65) Prior Publication Data

US 2005/0190545 A1 Sep. 1, 2005

(51) Int. Cl.[7] .............................................. H05K 1/18
(52) U.S. Cl. ..................... 361/764; 361/760; 174/254; 385/92
(58) Field of Search ............................... 361/749–750, 361/760–764; 174/254–255, 260–262, 52.5; 385/88, 92

(56) References Cited

U.S. PATENT DOCUMENTS 6,876,004 B2 * 4/2005 Rosenberg et al. ........... 257/81

2003/0180006 A1 * 9/2003 Loh et al. ..................... 385/88
2004/0156639 A1 * 8/2004 Schunk et al. ............... 398/140

* cited by examiner

Primary Examiner—Kamand Cuneo
Assistant Examiner—Tuan Dinh
(74) Attorney, Agent, or Firm—Bever, Hoffman & Harms, LLP; Partick T. Bever

(57) ABSTRACT

An arrangement including an optoelectronic component having terminal contacts, an electrical component having first electrical contacts and second electrical contacts, a printed circuit board, to which the second electrical contacts of the electrical component are connected, and a flexible conductor arrangement of a planar form having several conductor tracks. The conductor arrangement provides an electrical connection between the terminal contacts of the optoelectronic component and the first electrical contacts of the electrical component. The conductor arrangement has a first region with first contact regions and a second region with second contact regions. The optoelectronic component is mounted directly on the first region and its terminal contacts are connected to the first contact regions, and/or the electrical component is mounted directly on the second region and its first electrical contacts are connected to the second contact regions.

24 Claims, 4 Drawing Sheets

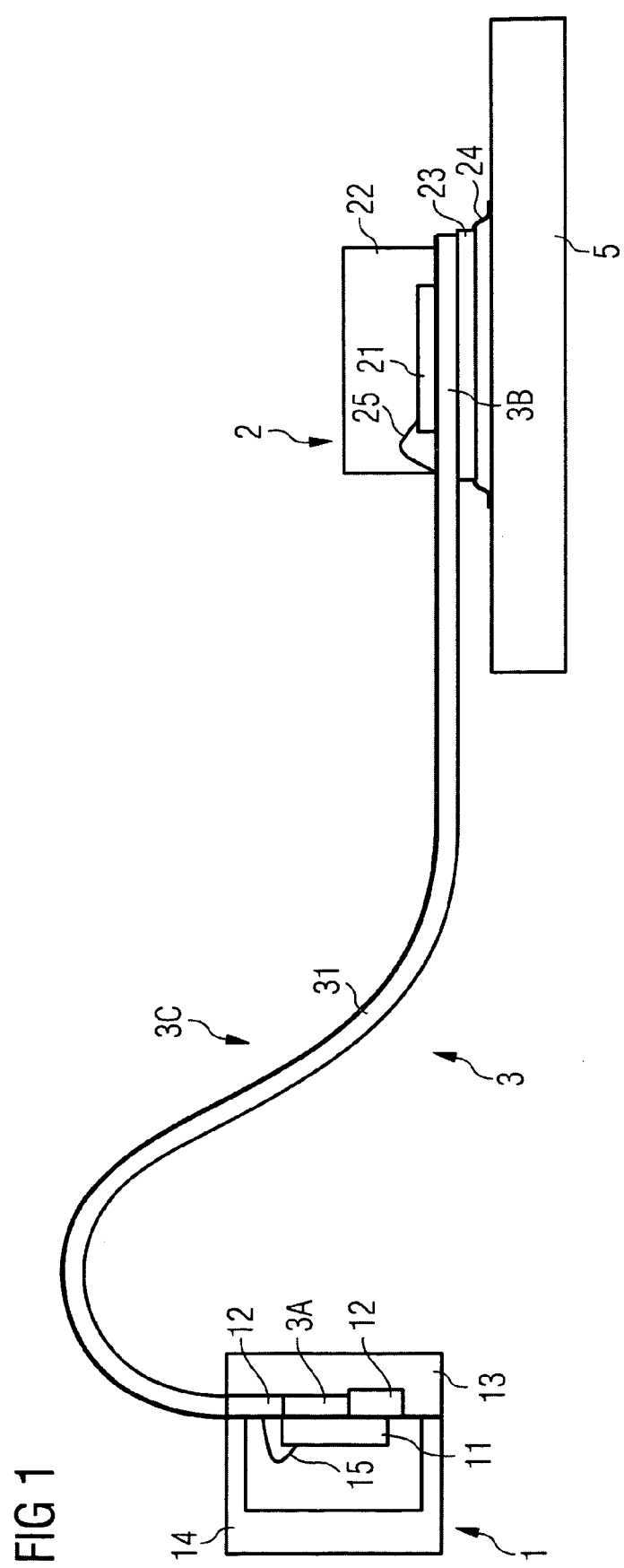

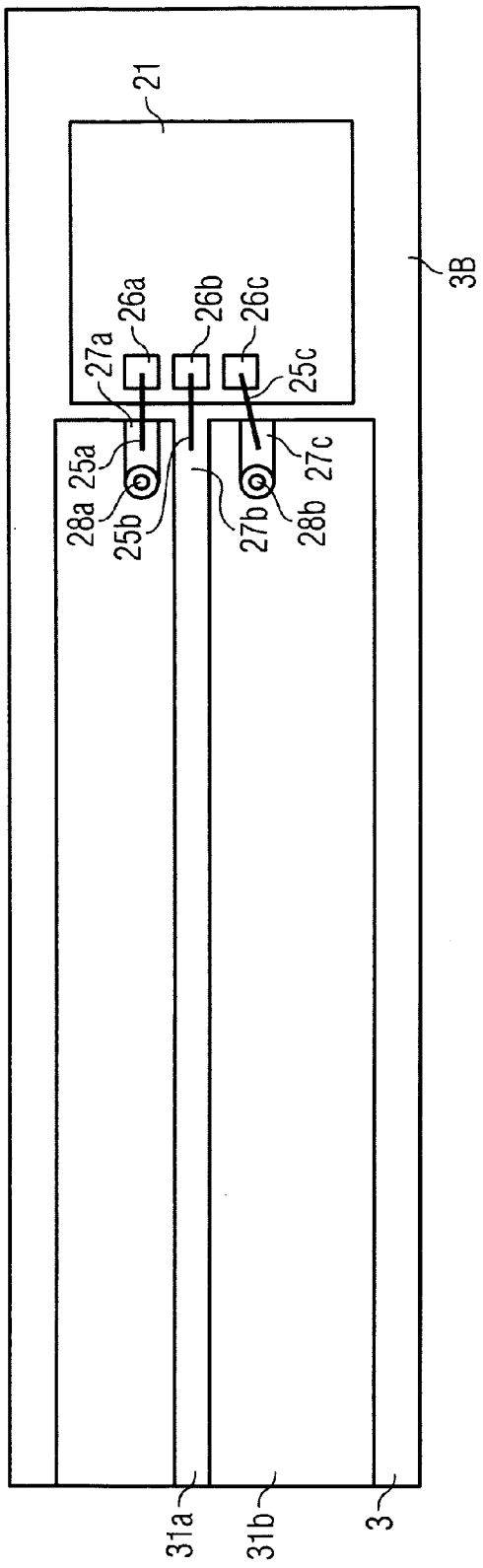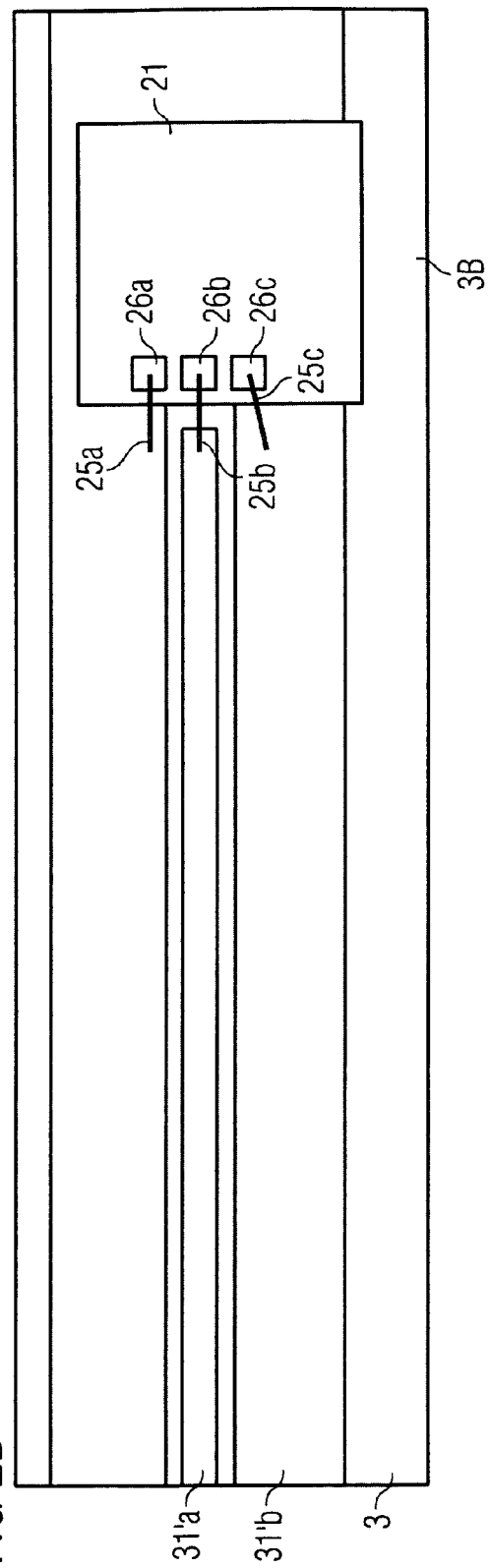

ARRANGEMENT FOR THE ELECTRICAL CONNECTION OF AN OPTOELECTRONIC COMPONENT TO AN ELECTRICAL COMPONENT

FIELD OF THE INVENTION

The invention relates to an arrangement for the electrical connection of an optoelectronic component to an electrical component using a flexible conductor. It relates in particular to the exact arrangement and contacting of an optoelectronic component and an electrical component with respect to a flexible conductor and serves for signal transmission at high data rates, in particular in the range between 10 Gbits/s and 40 Gbits/s.

BACKGROUND OF THE INVENTION

In an optoelectronic transmission module with a laser diode there is the requirement for the latter to be electrically connected to a laser driver device. In this respect, it must be noted that, for transmission of high data rates between 10 and 40 Gbits/s, the radio-frequency line between the laser driver device and the laser diode must either be as short as possible or impedance-matched. In the case of an impedance-matched line, it must be endeavored here to minimize the number of connections, which in each case act as discontinuities and consequently as an "impedance jump" of the signal transmission.

A laser driver device is generally an integrated circuit (IC) which is designed for maximum speed by using bipolar technology and takes up a high power loss. Since a laser diode generally reacts very sensitively to higher temperatures, it must also be endeavored to provide thermal decoupling between the laser diode and the laser driver device. Furthermore, it must be endeavored to ensure that the position of the optical axis of the transmission component, and consequently the possibilities for the coupling of an optical fiber, are not restricted by mechanical boundary conditions arising as a result of the electrical contacting of the transmission module.

It is known for this purpose to arrange the laser driver device and the laser diode in a common package. Such packages are known by the designations butterfly package and mini-DIL package. The laser driver device can in this case be placed very close to the laser diode. To avoid strong thermal coupling between the driver device and the laser diode, the additional integration of a Peltier cooler, which cools the laser diode, is generally required. However, in uncooled operation, arrangements of this type have strong thermal coupling. They are also relatively cost-intensive to produce on account of high component costs. Furthermore, required hermetic fiber feed-throughs can only be realized with great effort and the pigtail fiber outputs that are usually used are disadvantageous because of the requirement to maintain minimum bending radii in the construction of compact optoelectronic modules of a small type.

For the electrical connection of a laser driver device to a laser diode, it is also known to arrange the laser driver device on a separate printed circuit board. The laser diode is arranged in a transistor outline (TO) package, to which an optical connector with an optical fiber can be coupled in the manner of a plug by means of a connector receptacle. The electrical connection between the TO package and the laser driver device arranged on the printed circuit board takes place by means of a flexible conductor.

Flexible conductors are arrangements known in the prior art in which conductor tracks are applied on one side, both sides or a number of sides on a planar flexible dielectric.

A corresponding arrangement is schematically represented in FIG. 4. FIG. 4 shows as the main components a TO package 400 with a laser diode, a flexible conductor 300 and a printed circuit board 500, on which a packaged driver device 200 is arranged as a surface-mounted device. The signal outputs of the driver device 200 to the laser diode are connected to impedance-matched conductor tracks 510 of the printed circuit board. By means of a soldered connection 520, the conductor tracks 510 of the printed circuit board 500 are connected to continuing conductor tracks 310 of the flexible conductor 300, which are likewise impedance-matched. The electrical connection between the flexible conductor 300 and the TO package 400 takes place by means of terminal pins 420 of the TO package 400, which protrude from a base plate 410 of the TO package 400 and are inserted through via holes 430 of the flexible conductor. In this respect, only one such terminal pin 420 is represented in FIG. 4 for better overall clarity.

The known arrangement provides good thermal decoupling between the laser device and the laser driver device. Use of a flexible conductor also has the effect that the TO package and the printed circuit board are mechanically decoupled, so that there is extensive freedom of design with regard to the alignment of the TO package, and consequently of the optical axis of the light emission with respect to the printed circuit board.

Furthermore, flexible conductors have the advantage that they have favorable RF properties at high frequencies in the GHz range. This is particularly important for transmission with a high data rate of 10–40 Gbits/s. For this case of a high rate, the RF lines must be impedance-matched. In this case, the conductor tracks of a flexible conductor in the coplanar design or in the microstrip design can be monitored in terms of their impedance and can therefore be used advantageously. The conductor tracks of the printed circuit board also have a monitorable impedance.

On the other hand, the large number of connecting points in the path of the signal is problematical. The connections between the TO package and the flexible conductor, between the flexible conductor and the printed circuit board and between the printed circuit board and the electrical component cannot be monitored in terms of their impedance and represent unavoidable discontinuities in the path of the signal. Particularly the soldered connection 520 between the flexible conductor 300 and the printed circuit board 500 makes an RF connection with data rates higher than 10 Gbits/s impossible.

A further disadvantage of the known arrangement is that the soldered connection 520 must satisfy conflicting requirements. Firstly, the solder pads of the soldered connection 520 are responsible for a mechanical connection between the flexible conductor 300 and the printed circuit board 500. To this extent, it must be endeavored to form the solder pads with the largest possible surface area. At the same time, the high-frequency signal connection to the TO package 400 takes place by way of the solder pads of the soldered connection 520. Accordingly, it must be endeavored to make the solder pads have the smallest possible surface area. In practice, relatively large solder pads are used, on the one hand to provide adequate mechanical stability and on the other hand to allow tolerances between the position of the solder pads of the printed circuit board and the position of the assigned solder pads of the flexible conductor to be taken into account. This leads to the soldered connection 520 representing a great discontinuity in the path of the signal.

SUMMARY OF THE INVENTION

The present invention is directed to an arrangement for the electrical connection of an optoelectronic component to an electrical component which provides adequate signal quality in the transmission of RF signals between the electrical component and the optoelectronic component even at high data rates with up to 40 Gbits/s.

According to an embodiment of the invention, an arrangement has an optoelectronic component with terminal contacts, an electrical component with first electrical contacts and second electrical contacts, a printed circuit board, to which the second electrical contacts of the electrical component are connected, and a flexible conductor arrangement of a planar form with a plurality of conductor tracks. In this case, the flexible conductor arrangement provides an electrical connection between the terminal contacts of the optoelectronic component and the first electrical contacts of the electrical component. For this purpose, the flexible conductor arrangement has a first region with first contact regions (structures) and a second region with second contact regions (structures). The electrical component is mounted directly on the second region of the flexible conductor arrangement and its first electrical contacts are connected to the second contact regions of the conductor arrangement. In addition or as an alternative, the optoelectronic component is mounted directly on the first region of the flexible conductor arrangement and its terminal contacts are connected to the first contact regions of the conductor arrangement, it being preferred for both the electrical component and the optoelectronic component to be mounted directly on the corresponding region of the flexible conductor arrangement.

The solution according to the invention is distinguished by the idea that the optoelectronic component and/or the electrical component are placed directly on the flexible conductor arrangement and electrically connected to the latter. The flexible conductor arrangement serves as a mounting plane for the optoelectronic component and/or the electrical component. As a result, unnecessary soldered connections or other discontinuities in the path of the signal are avoided and the RF properties of the arrangement are significantly improved, so that signal transmission at high data rates is possible. In particular, two connecting points, and consequently discontinuities, in the path of the signal are saved in comparison with the prior art, to be specific the connection from the electrical component to the printed circuit board and from the printed circuit board to the flexible conductor arrangement.

In this case, bonding connections from the optoelectronic component and from the electrical component preferably pass directly to the impedance-matched conductor tracks of the flexible conductor arrangement without the provision of additional solder pads being required. However, direct contacting may also take place in some other way, for instance by means of flip-chip mounting directly on the flexible conductor arrangement.

In a preferred configuration of the invention, the first region of the conductor arrangement and/or the second region of the conductor arrangement are stiffened. On the other hand, a region lying in between is made flexible, so that the conductor arrangement is formed in the sequence rigid/flexible/rigid. Stiffening of the first and/or second region of the conductor arrangement preferably takes place by means of a rigid part, which for example consists of a metal or of an organic material such as epoxy resin. Stiffening may also be provided for example by means of an adhesive, which is applied to the corresponding region of the conductor arrangement and hardens there.

The optoelectronic component is preferably arranged in a package which is supported on the conductor arrangement. For this purpose, a particularly advantageous configuration provides that the package is hermetically connected to a rigid part, consisting in particular of metal. The rigid part may also be used for fixing a single-mode optical waveguide as part of a welding process. The rigid part is in this case arranged on the side of the flexible conductor arrangement that is facing a fiber connection. The rigid parts consequently provide increased mechanical stability of that region of the conductor arrangement on which an optoelectronic component or an electrical component is mounted. They possibly serve additionally for the connection to further components of the respective module.

In the second region of the conductor arrangement, which serves for the mounting of the electrical component, the rigid part preferably additionally provides an electrical connection between the second electrical contacts of the electrical component and the printed circuit board. For this purpose, it is provided for example that the rigid part has via holes, by way of which contacts of the electrical component are electrically connected to assigned contacts of the printed circuit board.

It generally applies that, in its second region, the conductor arrangement runs parallel to the printed circuit board and is thereby mechanically supported by the printed circuit board. The mechanical support takes place for example by means of soldered connections of the rigid part to the printed circuit board. The solution according to the invention consequently ensures that the contact regions of the flexible conductor which are connected to the first electrical contacts of the electrical component serve exclusively for carrying the radio-frequency signal and it is not necessary for a mechanical connection to be additionally provided between the flexible conductor arrangement and the printed circuit board. The mechanical connection between the flexible conductor arrangement and the printed circuit board takes place by means of soldered connections separate from these contact regions, in particular those between a rigid part of the corresponding region of the flexible conductor arrangement and the printed circuit board. This makes it possible to form the contact pads of the flexible conductor arrangement with a significantly smaller surface area, the said contact pads being connected to the first electrical contacts of the electrical component by means of bonding wires. As a result, a discontinuity in the path of the signal is further reduced.

The electrical component is preferably arranged in a package. The package is formed for example by a casting material, with which the electrical component is cast after an electrical connection of the component to the flexible conductor arrangement. The casting takes place in this case directly onto the second region of the flexible conductor arrangement, on which the electrical component is mounted.

The flexible conductor arrangement is preferably bent in a third region, lying between the first region and the second region. It is not stiffened in this bendable region. This makes it possible to align the first region of the conductor arrangement with the optoelectronic component substantially perpendicular to the second region of the conductor arrangement, which runs parallel to the printed circuit board.

The electrical device serves for the monitoring and control of the optoelectronic component and is preferably formed by a chip with an integrated circuit. The unpackaged chip is in this case mounted directly onto the second region of the conductor arrangement. The chip is, in particular, a laser driver chip. Accordingly, the optoelectronic component is a laser chip. However, other ways of realizing the optoelectronic component and the electrical component are also conceivable. For example, the optoelectronic component may be a photodiode with an integrated preamplifier. For this case, the electrical component is an additional amplifier, in particular a limiting amplifier.

BRIEF DESCRIPTION OF THE DRAWINGS

FIG. 1 schematically shows in side view an arrangement with an optoelectronic component, a flexible conductor and an electrical component, the electrical component and the optoelectronic component being mounted directly on the flexible conductor;

FIG. 2A shows in plan view a first exemplary embodiment of the arrangement of an electrical component on a flexible conductor;

FIG. 2B shows in plan view a second exemplary embodiment of the arrangement of an electrical component on a flexible conductor;

DESCRIPTION OF SEVERAL PREFERRED EXEMPLARY EMBODIMENTS

Figure 3A:
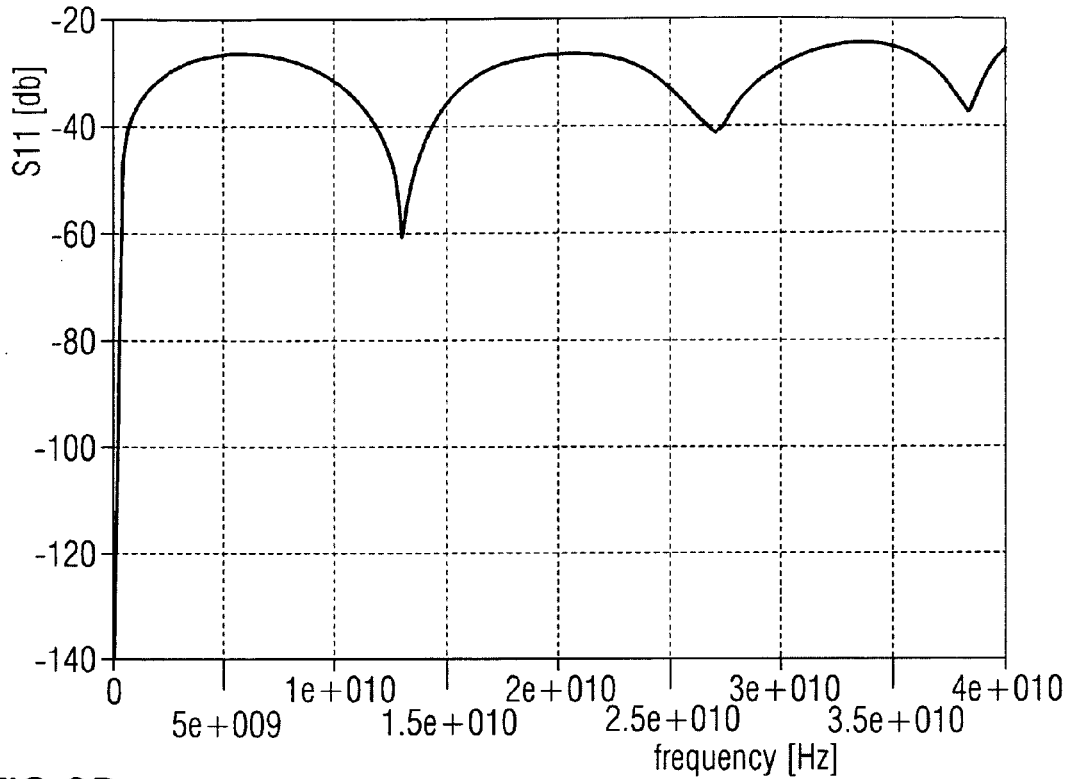
FIG. 3A shows the simulated signal reflection of the electrical connection between an optoelectronic component and an electrical component according to FIG. 1.

FIG. 1 schematically shows the construction of an arrangement with an optoelectronic module 1, an electrical module 2, a flexible conductor arrangement 3—hereafter also referred to as the flexible conductor—and a module printed circuit board 5.

The flexible conductor 3 has a plurality of conductor tracks, which are arranged in or on a flexible dielectric, it being possible for the flexible conductor 3 to be formed in one layer, two layers or else a number of layers. For example, the flexible conductor 3 is formed in two layers, one layer containing a conductor track 31 for the transmission of an RF signal and the other layer representing a ground layer. For reasons of overall clarity, only one conductor track 31 is represented in FIG. 1. For the purposes of the present invention, the ground layer is also regarded as a conductor track, so that there are always at least two conductor tracks. The flexible conductor has a first end region 3A, a bent middle region 3C and a second end region 3B.

It should be noted that the flexible conductor 3 has a planar form, i.e. the thickness is small in comparison with the longitudinal extent and the lateral extent.

In the exemplary embodiment represented, the optoelectronic module 1 is a transmission device with a laser diode chip 11 as the optoelectronic component, for example a Vertical Cavity Surface Emitting Laser (VCSEL), an edge-emitting (DFB or FP) laser diode or an electroabsorption-modulated laser (EML).

The laser diode chip 11 (hereafter referred to as the laser diode) is mounted directly on the first end region 3A of the flexible conductor 3. The laser diode 11 is in this case connected by a bonding wire 15 to a radio-frequency conductor track 31 of the flexible conductor 3. Furthermore, the end region 3A of the flexible conductor 3 has schematically represented ground connections 12 for a ground connection of the laser diode 11. A ceramic carrier 13 serves as a carrier element, on which the flexible conductor 3A is arranged. The ceramic carrier 13 may in this case be regarded as a rigid part of the flexible conductor 3 in the end region 3A. Also provided is a package or a covering cap 14, which is formed for example as a TO covering cap and is connected in a hermetically sealed manner to the carrier substrate 13. The module construction is merely represented schematically and may be configured in some other way.

In particular, it may be provided that the first end region 3A of the flexible conductor 3 has a metal stiffening. It is in this case a mechanical supporting element, for instance made of sheet metal, which is for example laminated on. Mechanical stiffening is advantageous, because it allows the covering cap 14 to be fixed by a welding process and to provide a hermetic seal.

As represented in FIG. 1, in the first end region 3A of the optoelectronic component 1, the flexible conductor 3 runs perpendicular to the plane of the printed circuit board 5. In the middle region 3B, adjoining the said first end region, the flexible conductor 3 runs in a curved manner and subsequently, in the second end region 3B, it runs parallel to the printed circuit board 5. The maximum curvature of the flexible conductor 3 in the middle region is in this case predetermined by a minimum bending radius, which is prescribed by the manufacturer in accordance with the formation of the flexible conductor.

The electrical module 2 has an electrical component 21. The electrical component 21 has first electrical contacts, which serve for the signal transmission and electrical connection to the optoelectronic component 11. Furthermore, it has second electrical contacts for the signal transmission and electrical connection to the printed circuit board 5.

The electrical component 21 is placed directly onto the flexible conductor 3 in an unpackaged form in the region 3B of the flexible conductor 3. FIG. 1 shows a bonding connection 25, which goes directly from a contact pad of the electrical component 21 to an associated impedance-matched conductor track 31 of the flexible conductor 3. The electrical component 21 is protected against external influences by means of a casting compound, which provides an encapsulation or a package 22. The mechanical connection between the electrical component 21 and the flexible conductor 3 takes place for example by adhesive bonding or indirectly by means of the encapsulation 22.

The electrical component is, for example, an IC laser driver device designed by using bipolar technology or, when the optoelectronic component 11 is formed as a receiving component, a post-amplifier device.

As already mentioned, the flexible conductor 3 is preferably stiffened in its end regions 3A, 3B, so that the flexible conductor 3 is flexible only in its middle region 3C and accordingly represents a "rigid-flexible-rigid" leadframe. Depending on requirements, the rigid parts may consist of an organic leadframe material, for example epoxy resin, or of metal. In FIG. 1, provided underneath the region 3B of the flexible conductor on which the electrical component 21 is mounted is a rigid part or reinforcing element 23, which runs parallel to the flexible conductor 3 and to the printed circuit board 5.

The rigid part 23 is arranged on the module printed circuit board 5. It provides on the one hand a mechanical connection of the flexible conductor 3, and consequently also of the electrical component arranged on the flexible conductor 3, to the module printed circuit board 5. Furthermore, an electrical connection is provided between electrical contacts of the printed circuit board 5 and the second electrical contacts of the electrical component 21. As represented in FIG. 1, the rigid part 23 is in this case connected for example by means of contact legs 24 to corresponding contact pads of the printed circuit board 5. The corresponding soldered connections provide both an electrical connection and a mechanical connection.

The module printed circuit board 5 is, for example, a transceiver board with further application-specific circuits, capacitors, resistors, etc. (not represented). The module printed circuit board 5 has in this case contact regions or contact pads (contact structures), which are connected to the second electrical contacts of the electrical component. For the case in which the electrical component 21 is formed as a driver device for a laser diode, logic signals in particular are passed to the driver device by way of the printed circuit board 5. The driver signal of the driver device 21 is passed to a conductor track of the flexible conductor by way of a contact bonded directly onto the flexible conductor 3.

In this respect it is pointed out that in the driver device 21 a digital decision threshold typically lies between the incoming logic signal and the analog driver signal, so that the electrical connection between the driver device 21 and the module printed circuit board 5 is less critical.

FIGS. 2A, 2B show two exemplary embodiments of possible forms in which the transition between the electrical component 21 and the flexible conductor 3 can be realized in the view of a layout. FIG. 2A shows here a configuration of the flexible conductor in the microstrip design. On the upper side of the flexible conductor 3 there is a conductor track 31a, which serves for the transmission of a high-frequency ("hot") signal. On the underside of the flexible conductor there is a ground layer 31b, which in the terminology of the present invention likewise represents a conductor track. The electrical component 21 has three first contacts or contact pads 26a, 26b, 26c, which are connected by means of bonding wires 25a, 25b, 25c to corresponding contact regions 27a, 27b, 27c of the flexible conductor 3. The upper and lower contact regions 27a, 27c are in this case connected by means of via holes 28a, 28b to the ground layer 31b of the underside. A reference potential such as GROUND or $V_{cc}$ is provided on the ground layer 31b by way of the bonding wires 25a, 25c and contact regions 27a, 27c. A radio-frequency signal is transmitted over the middle bonding wire 25b, which bonds directly to the conductor track 31a. The corresponding contact region 27b is formed by the end of the conductor track 31a.

The configuration of FIG. 2B corresponds substantially to the configuration of FIG. 2A. Here, however, the flexible conductor 3 is configured in the coplanar design. Both the conductor track 31'a for the radio-frequency signal and the ground layer 31'b are arranged on the upper side. Via holes are not provided of course in the case of this configuration.

The transition between the optoelectronic component 11 and the flexible conductor 3 may be realized in a corresponding way.

It is pointed out that the electrical component 21 also has second contacts (not represented) for the connection of the electrical component to the printed circuit board 5 or contact pads arranged on the printed circuit board. With reference to FIGS. 1, 2A, 2B, such a connection is established for example by bonding wires being passed from the electrical component 21 by way of via holes to the underside of the flexible conductor 3, respectively connected there for example by means of a ball contact to via holes of the rigid part 23 and connected by way of such via holes of the rigid part 23 by means of a soldered connection to associated contact pads of the printed circuit board (not represented in any more detail).

Figure 3B:
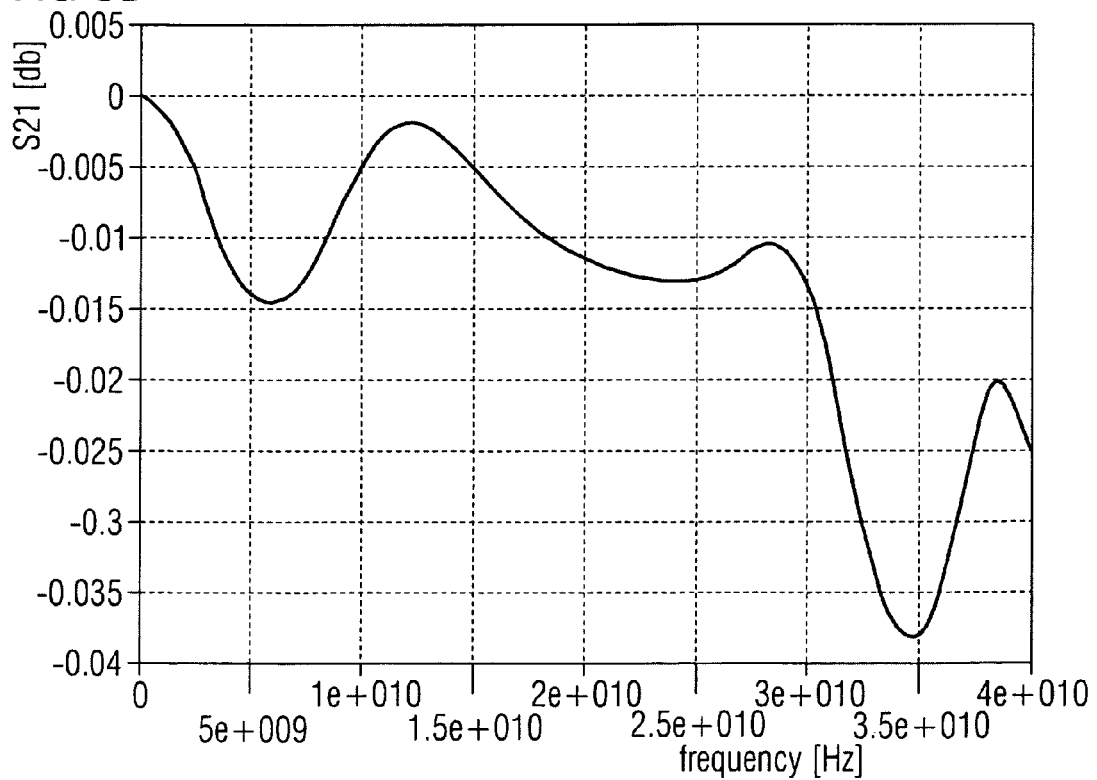
FIG. 3B shows the simulated signal transmission of the electrical connection between an optoelectronic component and an electrical component according to FIG. 1.
Figure 4:
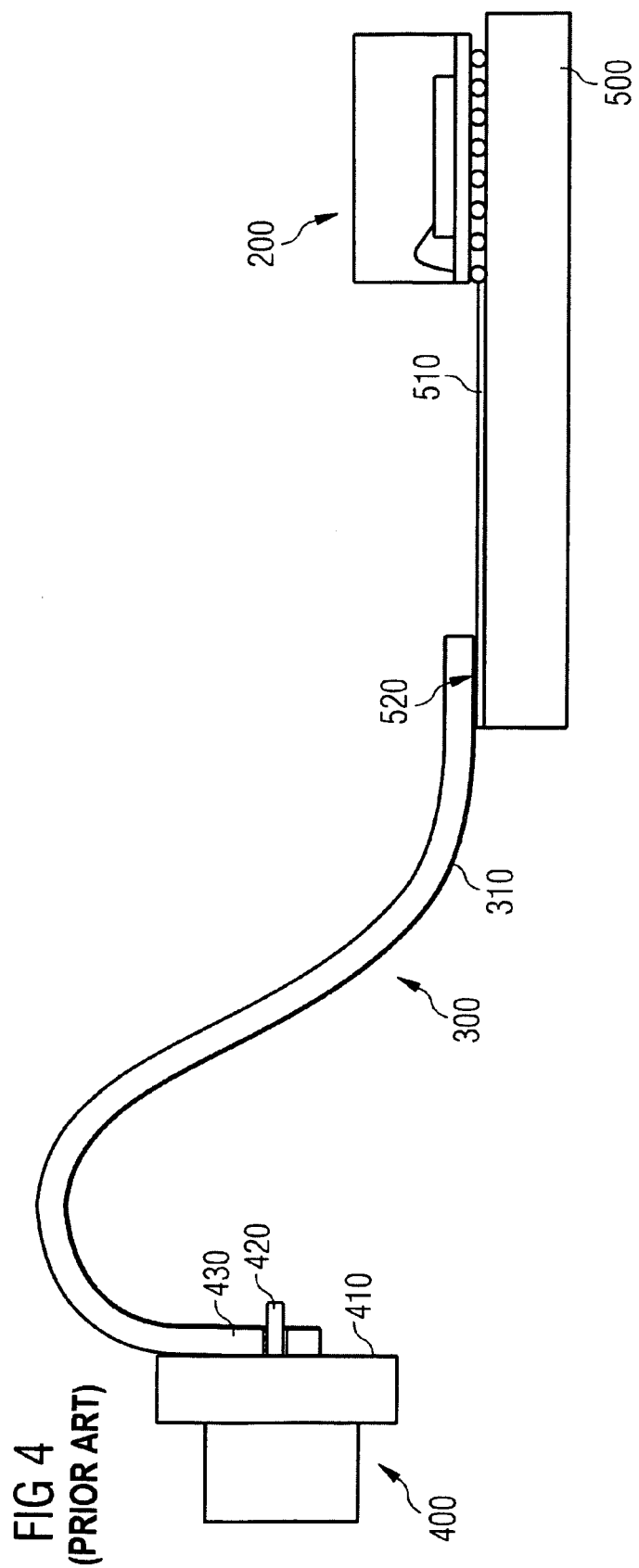
FIG. 4 shows an arrangement known in the prior art with a TO package, a flexible conductor and a printed circuit board.

FIGS. 3A, 3B show the simulated reflection and transmission of the electrical connection between the optoelectronic component 1 and the electrical device 2 in dependence on the signal frequency. The reflection is below −20 dB in the entire frequency range from 0 to 40 GHz, so that the construction described is suitable for data transmission at a high rate of up to 40 Gbits/s.

The invention is not restricted in its configuration to the exemplary embodiments represented above, which are to be understood as merely given by way of example. For example, more than two conductor tracks (for the RF signal and ground) may be realized on the flexible conductor. For instance, a further conductor track may be provided for a second RF signal, if differential driving of the laser diode 11 takes place. Furthermore, conductor tracks for the connection of low-frequency signals (for example concerning the signals of a monitor diode) may be provided.

Furthermore, it is pointed out that the term "printed circuit board" is to be understood with a broad meaning in the context of the present invention. Any structure by means of which signals are passed to the electrical component 21 or received from it represents a printed circuit board for the purposes of the present invention. A customary planar form is preferred here, but not necessary.

A person skilled in the art appreciates that there are numerous alternative configurational variants which, in spite of deviating from the exemplary embodiments described, make use of the teaching defined in the claims which follow.

We claim:

1. An arrangement comprising:
   an optoelectronic component with terminal contacts,
   an electrical component with first electrical contacts and second electrical contacts,
   a printed circuit board, to which the second electrical contacts of the electrical component are connected, and
   a flexible conductor arrangement of a planar form and including a plurality of conductor tracks,
   wherein the plurality of conductor tracks provide an electrical connection between the terminal contacts of the optoelectronic component and the first electrical contacts of the electrical component,
   wherein the flexible conductor arrangement further comprises a first region with first contact regions and a second region with second contact regions, and
   wherein at least one of:
      the optoelectronic component is mounted directly on the first region of the conductor arrangement such that the terminal contacts are connected to the first contact regions of the conductor arrangement, and
      the electrical component is mounted directly on the second region of the conductor arrangement such that the first electrical contacts are connected to the second contact regions of the conductor arrangement.

2. The arrangement according to claim 1, wherein the first region of the conductor arrangement is stiffened.

3. The arrangement according to claim 1, wherein the optoelectronic component is arranged in a package that is supported on the conductor arrangement.

4. The arrangement according to claim 1, wherein the second region of the conductor arrangement is stiffened.

5. The arrangement according to claim 1, wherein the conductor arrangement is arranged parallel to the printed circuit board and is supported by the printed circuit board in its second region.

6. The arrangement according to claim 1, wherein the electrical component is arranged in a package.

7. The arrangement according to claim 1, wherein the first region of the conductor arrangement and the second region of the conductor arrangement are formed at opposite ends of the conductor arrangement.

8. The arrangement according to claim 1, wherein the first region of the conductor arrangement is aligned substantially perpendicular to the second region of the conductor arrangement.

9. The arrangement according to claim 1, wherein the flexible conductor arrangement is formed by a flexible conductor.

10. The arrangement according to claim 1, wherein the conductor tracks of the conductor arrangement are impedance-matched.

11. The arrangement according to claim 1, wherein an electrical contact of the electrical component is connected to an assigned second contact region of the conductor arrangement by a bonding wire.

12. The arrangement according to claim 1, wherein a terminal contact of the optoelectronic component is connected to an assigned first contact region of the conductor arrangement by a bonding wire.

13. The arrangement according to claim 1, wherein the electrical component comprises an unpackaged chip, which is mounted directly on the second region of the conductor arrangement.

14. The arrangement according to claim 1, wherein the optoelectronic component comprises an unpackaged chip, which is mounted directly on the first region of the conductor arrangement.

15. The arrangement according to claim 2, wherein the stiffened region of the conductor arrangement includes a rigid part.

16. The arrangement according to claim 4, wherein the stiffened region of the conductor arrangement includes a rigid part.

17. The arrangement according to claim 6, wherein the package comprises a casting materialformed over the electrical component after an electrical connection of the electrical component to the conductor arrangement.

18. The arrangement according to claim 7, wherein the flexible conductor arrangement is bent in a third region that extends between the first region and the second region.

19. The arrangement according to claim 13, wherein the electrical component comprises a laser driver chip.

20. The arrangement according to claim 14, wherein the optoelectronic component comprises a laser chip.

21. The arrangement according to claim 16, wherein the second electrical contacts of the electrical component are electrically connected to the printed circuit board by electrical contacts mounted on the rigid part.

22. The arrangement according to claim 16, wherein the electrical component is mechanically supported on the printed circuit board by the rigid part.

23. An arrangement comprising:
a flexible conductor arrangement including a first region having a plurality of first contact structures, a second contact region having a plurality of second contact structures, and a third region including a plurality of conductor tracks, wherein each conductor track extends between a first contact structure of the first contact structures and a corresponding second contact structure of the second contact structures;
an optoelectronic component mounted on the first region of the flexible conductor arrangement, the optoelectronic component including terminal contacts that are respectively electrically connected to the plurality of first contact structures of the flexible conductor arrangement;
a printed circuit board including a plurality of third contact structures; and
an electrical component mounted on the printed circuit board, the electrical component including first electrical contacts that are respectively electrically connected to corresponding said second contact structures, and second electrical contacts that are respectively electrically connected to corresponding said third contact structures.

24. An arrangement comprising:
a flexible conductor arrangement including a first region having a plurality of first contact structures, a second contact region having a plurality of second contact structures, and a third region including a plurality of conductor tracks, wherein each conductor track extends between a first contact structure of the first contact structures and a corresponding second contact structure of the second contact structures;
an optoelectronic component including terminal contacts that are respectively electrically connected to the plurality of first contact structures of the flexible conductor arrangement;
a printed circuit board including a plurality of third contact structures; and
an electrical component mounted on the flexible conductor arrangement and the printed circuit board such that the second region of the flexible conductor arrangement is positioned between the electrical component and the printed circuit board, the electrical component including:
first electrical contacts that are respectively electrically connected to corresponding said second contact structures, and
second electrical contacts that are respectively electrically connected to corresponding said third contact structures.

* * * * *